(12) United States Patent
Fodor et al.

(10) Patent No.: US 7,024,105 B2
(45) Date of Patent: Apr. 4, 2006

(54) SUBSTRATE HEATER ASSEMBLY

(75) Inventors: Mark A. Fodor, Los Gatos, CA (US); Sophia M. Velastegui, Sunnyvale, CA (US); Soovo Sen, Sunnyvale, CA (US); Visweswaren Sivaramakrishnan, Santa Clara, CA (US); Peter Wai-Man Lee, San Jose, CA (US); Mario David Silvetti, Morgan Hill, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/684,054

(22) Filed: Oct. 10, 2003

(65) Prior Publication Data

US 2005/0078953 A1  Apr. 14, 2005

(51) Int. Cl.
*F26B 19/00* (2006.01)

(52) U.S. Cl. .................. 392/418; 392/416; 219/390; 219/405; 219/411; 118/724; 118/725; 118/50.1; 118/728; 118/729; 118/732

(58) Field of Classification Search ............... 219/390, 219/405, 411; 392/416, 418; 118/724, 725, 118/50.1, 728, 729, 732
See application file for complete search history.

(56) References Cited

U.S. PATENT DOCUMENTS

| | | | |
|---|---|---|---|
| 5,683,518 A | 11/1997 | Moore et al. | |
| 5,848,889 A | 12/1998 | Tietz et al. | 432/258 |
| 5,882,419 A | 3/1999 | Sinha et al. | |
| 5,920,797 A | 7/1999 | Ballance et al. | 438/758 |
| 6,133,152 A | 10/2000 | Bierman et al. | 438/706 |
| 6,159,299 A | 12/2000 | Koai et al. | 118/715 |
| 6,176,198 B1 | 1/2001 | Kao et al. | 118/723 ME |
| 6,231,674 B1 * | 5/2001 | Chen et al. | 118/720 |
| 6,280,183 B1 | 8/2001 | Mayur et al. | 432/258 |
| 6,344,105 B1 | 2/2002 | Daugherty et al. | 156/345 |
| 6,344,631 B1 | 2/2002 | Chacin | 219/390 |
| 6,350,320 B1 | 2/2002 | Sherstinsky et al. | 118/715 |
| 6,383,931 B1 | 5/2002 | Flanner et al. | 438/689 |
| 6,464,794 B1 | 10/2002 | Park et al. | 118/728 |
| 6,497,767 B1 | 12/2002 | Okase et al. | |

(Continued)

FOREIGN PATENT DOCUMENTS

EP  0818558 A  1/1998

(Continued)

OTHER PUBLICATIONS

International Search Report/Written Opinion of the International Searching Authority; Mail Date of Search Jun. 15, 2005; pp. 1-2.

*Primary Examiner*—Shawntina Fuqua
(74) *Attorney, Agent, or Firm*—Patterson & Sheridan (57) ABSTRACT

A substrate heater assembly for supporting a substrate of a predetermined standardized diameter during processing is provided. In one embodiment, the substrate heater assembly includes a body having an upper surface, a lower surface and an embedded heating element. A substrate support surface is formed in the upper surface of the body and defines a portion of a substrate receiving pocket. An annular wall is oriented perpendicular to the upper surface and has a length of at least one half a thickness of the substrate. The wall bounds an outer perimeter of the substrate receiving pocket and has a diameter less than about 0.5 mm greater than the predetermined substrate diameter.

23 Claims, 11 Drawing Sheets

U.S. PATENT DOCUMENTS

| | | |
|---|---|---|
| 6,589,352 B1 * | 7/2003 | Yudovsky et al. .......... 118/729 |
| 6,623,597 B1 | 9/2003 | Han et al. |
| 2002/0066727 A1 | 6/2002 | Park |
| 2003/0013315 A1 | 1/2003 | Park et al. |

FOREIGN PATENT DOCUMENTS

| | | |
|---|---|---|
| EP | 1 106 715 | 6/2001 |
| EP | 1106715 A | 6/2001 |
| EP | 1199380 A | 4/2002 |

* cited by examiner

SUBSTRATE HEATER ASSEMBLY

BACKGROUND OF THE INVENTION

1. Field of the Invention

The present invention generally relates to semiconductor substrate processing systems. More specifically, the invention relates to an apparatus for supporting and heating a substrate in a semiconductor substrate processing system.

2. Description of the Related Art

Accurate reproducibility of substrate processing is an important factor for improving productivity when fabricating integrated circuits. Precise control of various process parameters is required for achieving consistent results across a substrate, as well as the results that are reproducible from substrate to substrate. More particularly, uniformity of deposited material layers is one of requirements for achieving good manufacturing yield.

In a chemical vapor deposition (CVD) processing chamber, the substrate is typically disposed on a heated substrate support during processing. The substrate support generally includes embedded electric heating elements for controlling the temperature of the substrate. The substrate support may additionally include channels and grooves for a gas (e.g., helium (He), argon (Ar), and the like) to facilitate the transfer the heat between the substrate support and the substrate. Additionally, the substrate heater assembly may also comprise embedded radio-frequency (RF) electrodes for applying RF bias to the substrate during various plasma enhanced processes.

During a deposition process (e.g., chemical vapor deposition (CVD), plasma enhanced CVD (PECVD), and the like), central and peripheral regions of the substrate are exposed to different processing conditions. Differences in the processing conditions generally result in the low uniformity for the deposited layers. For example, substrates processed on conventional heated substrate supports often allow deposition to occur right up to the substrate's edge, and may also have greater thickness of a deposited layer near the edge of the substrate relative to material deposited in the center of the substrate. Non-uniformity of the deposited layers limits yield and productivity of the deposition process, as well as overall performance of the integrated circuits. Additionally, deposited material along the edge of the substrate may be problematic to correctly positioning substrates on robotic transfer mechanisms. If the substrate is not held in a pre-defined position on the robotic transfer mechanism, the substrate may become damaged or dropped during transfer, or become misaligned when placed in processing equipment resulting in poor processing results.

Therefore, there is a need in the art for a substrate heater assembly for facilitating deposition of uniform material layers on the substrates without depositing material along the substrate's edge during fabrication of integrated circuits in a semiconductor substrate processing system.

SUMMARY OF THE INVENTION

A substrate heater assembly for supporting a substrate of a predetermined standardized diameter during processing is provided. In one embodiment, the substrate heater assembly includes a body having an upper surface, a lower surface and an embedded heating element. A substrate support surface is formed in the upper surface of the body and defines a portion of a substrate receiving pocket. An annular wall is oriented perpendicular to the upper surface and has a length of at least one half a thickness of the substrate. The wall bounds an outer perimeter of the substrate receiving pocket and has a diameter less than about 0.5 mm greater than the predetermined substrate diameter.

BRIEF DESCRIPTION OF THE DRAWINGS

The teachings of the present invention can be readily understood by considering the following detailed description in conjunction with the accompanying drawings, in which:

FIGS. 3A–7A and 3B–7B depict schematic, perspective and cross-sectional views of alternate embodiments of an annular ring of the substrate heater assembly of FIG. 1;

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a substrate heater assembly of a substrate support for supporting a substrate in a process chamber (e.g., chemical vapor deposition (CVD) chamber, plasma enhanced CVD (PECVD) chamber, and the like) of a substrate processing system. The inventive substrate heater assembly may be used to facilitate deposition of material layers requiring low thickness non-uniformity across a substrate (e.g., silicon (Si) wafer, and the like), as well within a batch of the substrates being processed. Herein either a CVD or PECVD chamber (or reactor) is referred to as a CVD chamber (or reactor).

An example of a CVD reactor that may be used in conjunction with the invention is the Producer® reactor or the DXZ® reactor (both available from Applied Materials, Inc. of Santa Clara, Calif.). It should be noted, however, that other CVD reactors and/or process chambers may also be used to practice the invention. The Producer® reactor and DXZ® reactor are disclosed in commonly assigned U.S. Pat. No. 5,855,681, issued Jan. 5, 1999 and U.S. Pat. No. 6,364,954 B2, issued Apr. 2, 2002, respectively, which are incorporated herein by reference. The Producer® reactor comprises a CVD chamber having two isolated processing regions, where each of the processing regions may be used for depositing thin material layers. Salient features of the exemplary Producer® reactor are briefly discussed below.

Figure 1:
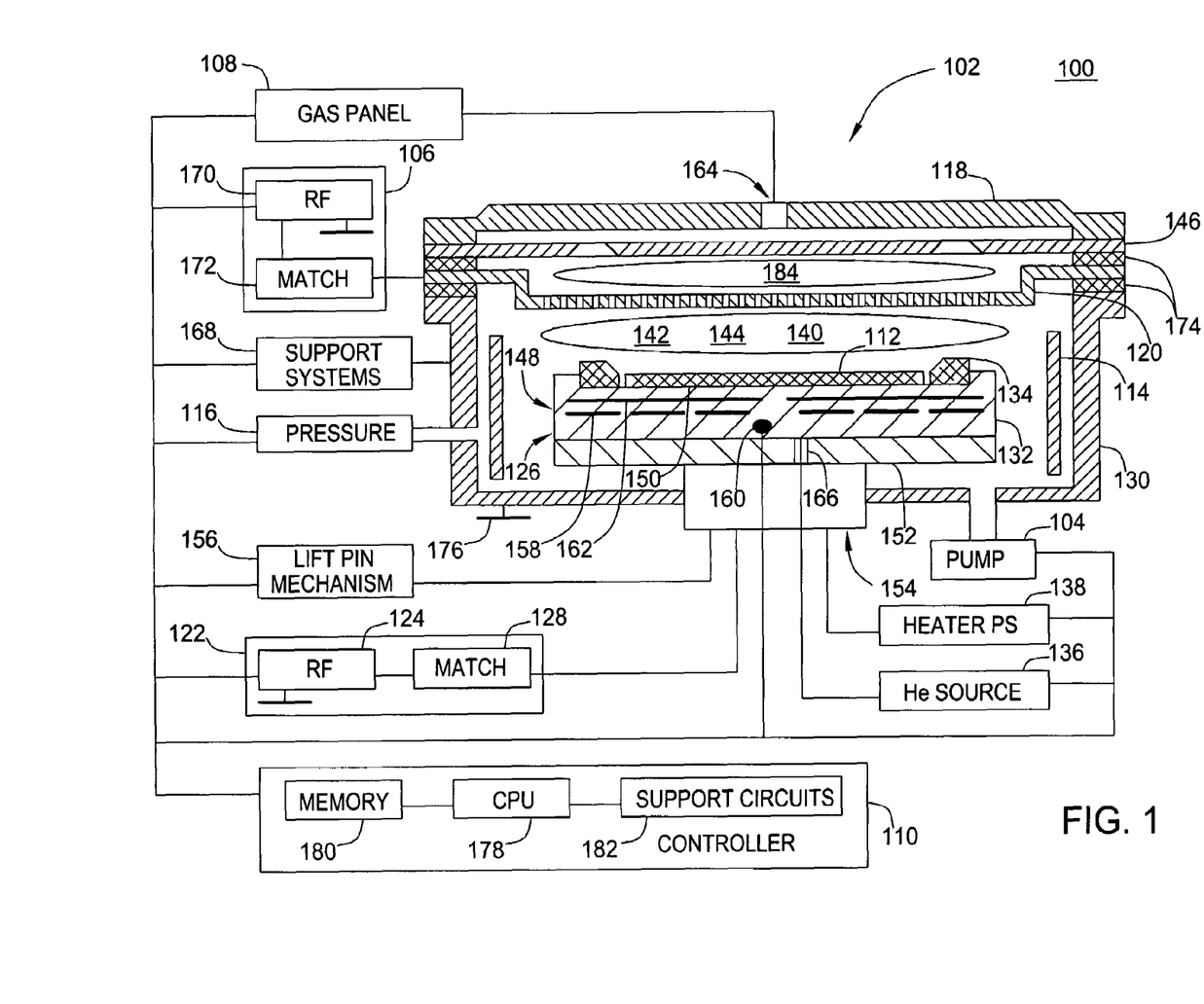
FIG. 1 depicts a schematic diagram of an exemplary processing reactor comprising a substrate support having a substrate heater assembly in accordance with one embodiment of the present invention.

FIG. 1 depicts one processing region of the exemplary Producer® reactor 100 as a process chamber 102. The images in FIG. 1 are simplified for illustrative purposes and are not depicted to scale.

The reactor 100 comprises a process chamber 102 and a controller 110. The process chamber 102 generally comprises a body (wall) 130 having a lid assembly 118, a substrate support pedestal 126, a vacuum pump 104, and shield(s) 114 used to protect an inner surface of the wall 130 during a CVD process. The wall 130 is formed from a conductive material (e.g., aluminum (Al), stainless steel, and the like) and coupled to a ground terminal 176 of the process chamber 102.

In one embodiment, the lid assembly 118 is coupled to a gas panel 108 via a port 164 and comprises a buffer plate 146, a showerhead 120, and isolators 174. The buffer plate 146 facilitates mixing of individual process gases in a plenum 184. The showerhead 120 is located above the support pedestal 126 and disperses a process gas mixture 142 into a reaction volume 144 of the process chamber 102. The showerhead 120 may also comprise different zones such that various gases can be released into the process chamber 102 at various flow rates.

The support pedestal 126 comprises a substrate heater assembly 148, a base plate 152, and a back plane assembly 154. The back plane assembly 154 is coupled to a source 122 of substrate bias power, a controlled heater power supply 138, and a source 136 of a backside gas (e.g., helium (He)), as well as to a lift pin mechanism 156. During substrate processing, the support pedestal 126 supports a substrate 112 and controls the temperature and biasing of the substrate. The substrate 112 is generally a standardized semiconductor wafer, for example a 200 mm or 300 mm wafer.

The substrate heater assembly 148 comprises a body (heater member 132) and an annular ring 134 disposed in a recess (substrate pocket) 150 of the heater member. The heater member 132 further comprises a plurality of embedded heating elements 158, a temperature sensor (e.g., thermocouple) 160, and a plurality of radio-frequency (RF) electrodes 162. The embedded heating elements 158 are coupled to the heater power supply 138. The temperature sensor 160 monitors, in a conventional manner, the temperature of the heater member 132. The measured temperature is used in a feedback loop to regulate the output of the heater power supply 138. The embedded RF electrodes 162 couple the source 122 to the substrate 112, as well as to a plasma 140 of the process gas mixture 142 in the reaction volume 144.

The temperature of the substrate 112 is controlled by stabilizing a temperature of the heater member 132. In one embodiment, the helium gas from a gas source 136 is provided via a gas conduit 166 to grooves (or, alternatively, positive dimples) 230 (shown using broken lines in FIG. 2A below) formed in the heater member 132 under the substrate 112. The helium gas provides a heat transfer between the heater member 132 and the substrate 112 and facilitates uniform heating of the substrate. Using such thermal control, the substrate 112 may be maintained at a temperature between about 200 and 800 degrees Celsius.

The source 122 generally comprises a RF generator 124 and a matching network 128. The generator 124 generally is capable of producing up to 5000 W of continuous or pulsed power at a frequency is a range from about 50 kHz to 13.6 MHz. In other embodiments, the generator 124 may be a pulsed DC power generator.

The vacuum pump 104 maintains a desired gas pressure in the chamber 102, as well as evacuates post-processing gases and by-products of the CVD process from the chamber. Gas pressure in the process chamber 102 is monitored using a pressure sensor 116, and the measured pressure may be used in a feedback loop controlling the gas pressure in the process chamber.

In one embodiment, the showerhead 120 is coupled to a source 106 comprising a RF generator 170 and a matching network 172. The RF generator 170 may typically produce between 500 and 3000 W at about 50 kHz to 13.6 MHz. Together, the showerhead 120 and substrate support pedestal 126 form a pair of spaced apart electrodes. When the source 106 applied RF power to such electrodes, the process gas mixture 142 in the reaction volume 144 may be ignited into the plasma 140.

The lift pin mechanism 156 is used to lower the substrate 112 into the substrate pocket 150 of the substrate heater assembly 148 or to raise the substrate off the substrate heater assembly. The heater member 132 comprises a plurality of openings 232 (shown in FIG. 2A below) for lift pins of the mechanism 156.

The process chamber 102 also comprises conventional systems for performing internal diagnostics, process control, detection of an end of a CVD process, and the like. Such systems are collectively shown in FIG. 1 as support systems 168.

The controller 110 comprises a central processing unit (CPU) 178, a memory 180, and a support circuit 182. The CPU 178 may be of any form of a general purpose computer processor that can be used in an industrial setting. The software routines can be stored in the memory 180, such as random access memory, read only memory, floppy or hard disk drive, or other form of digital storage. The support circuit 182 is conventionally coupled to the CPU 178 and may comprise cache, clock circuits, input/output subsystems, power supplies, and the like.

The software routines, when executed by the CPU 178, transform the CPU into a specific purpose computer (controller) 110 that controls the reactor 100 such that the processes are performed in accordance with the present invention. The software routines may also be stored and/or executed by a second controller (not shown) that is located remotely from the reactor 100.

Figures 2A, 2B:
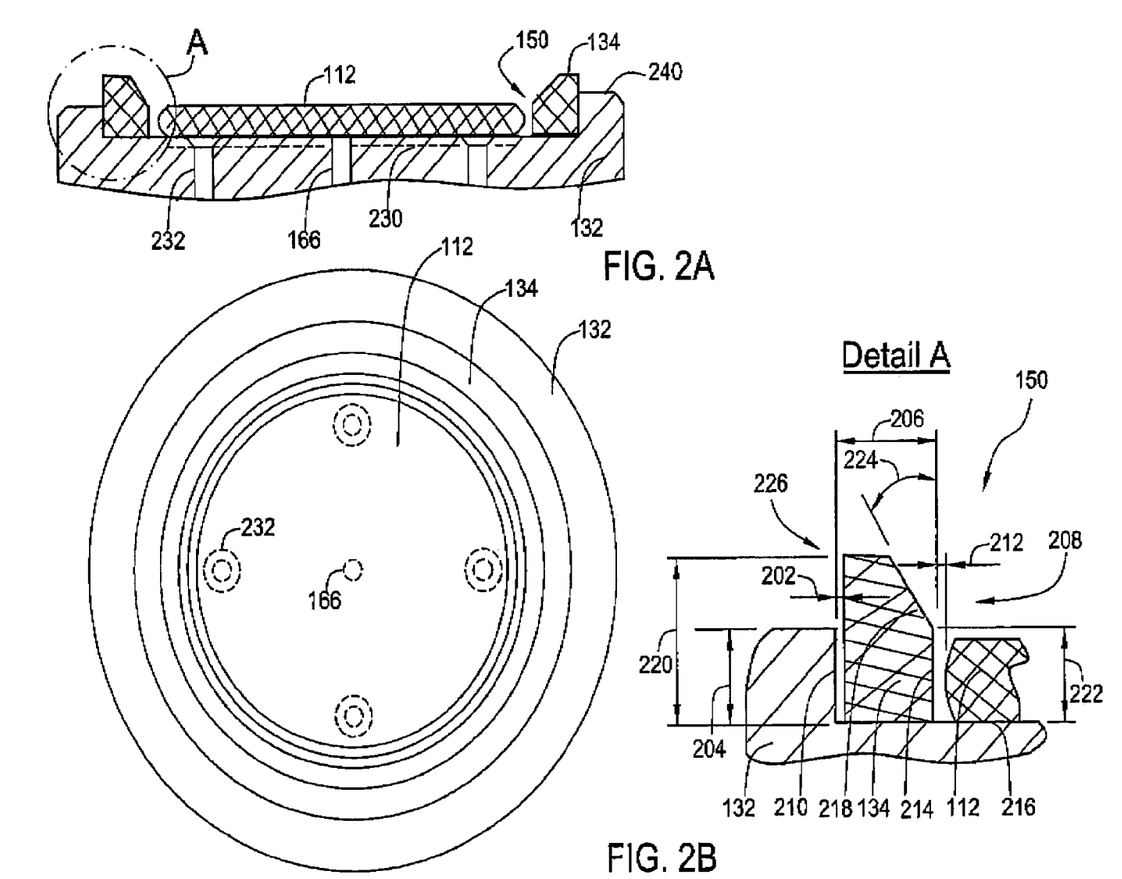
FIG. 2 depicts a schematic, top plan view of the substrate heater assembly of FIG. 1 in accordance with one embodiment of the present invention.

FIGS. 2A and 2B depict schematic, cross-sectional and top plan views of the substrate heater assembly 148 of FIG. 1, respectively. In one embodiment, the heating member 132 and annular ring 134 are formed of a ceramic material, such as aluminum nitride (AlN), aluminum oxide ($Al_2O_3$), and the like. The annular ring 134 is centrally disposed and retained by gravity in the substrate pocket 150 having a depth 204 of about 0.5 to 2.5 mm.

The annular ring 134 is sized such that a radial gap 202 between a flange 226 of the ring 134 and a wall 210 of the heating member 132 has a minimal value, e.g., less than about 0.2 mm. A radial gap 212 defined between an inner edge 208 of the ring 134 and an edge of the centrally located substrate 112 is less than 0.5 mm, and in one embodiment, is about 0.1 to 0.5 mm. The small distance of the gap 212, along with the recessed orientation of the substrate relative to an upper surface 240 of the support results in the substantial elimination of deposition of material on the edge of the substrate 112 during processing. The tight configuration wall 210 of the pocket 150 and the walls relative height to the substrate 112 perturbs the plasma field away from the edge (i.e., towards the center) of the substrate 112, thereby reducing and/or eliminating deposition on the edge of the substrate. Additionally, the configuration of the wall 210 perturbs the reactant gas and/or vapor flow at the edge of the substrate such that the local volume of gas becomes depleted of reactants, thereby contributing to the reduction and/or eliminating deposition on the edge of the substrate. Further, the configuration of the wall 210 also perturbs the temperature at the edge of the substrate such that the deposition rate is locally reduced, thereby additionally contributing to the reduction and/or eliminating deposition on the edge of the substrate.

A height 220 of the annular ring 134 is generally between 0.7 and 7 mm. A width 206 of the annular ring 134 is selected such that a ratio of the height 220 to the width 206 is between about 0.05:1 and 0.5:1. The inner edge 208 of the annular ring comprises a wall 214 and a bevel 218. The wall 214 is disposed substantially orthogonal to a surface 216 of the substrate pocket 150. The wall 214 is configured to extend in a vertical direction at least about one half the thickness of the substrate. In one embodiment, the wall 214 has a height 222 of about 0.3 to 3 mm, while the bevel 218 may taper from the substrate 112 outward and upward at an angle 224 of about 10 to 40 degrees.

FIGS. 3A–7A and 3B–7B depict schematic, perspective and cross-sectional views of alternate embodiments of the annular ring 134. The cross-sectional views in FIGS. 3B–7B are taken along centerline of the perspective views in the FIGS. 3A-7A, respectively. Images in FIGS. 3A–7A and 3B–7B are simplified for illustrative purposes and are not depicted to scale.

Figure 3A:
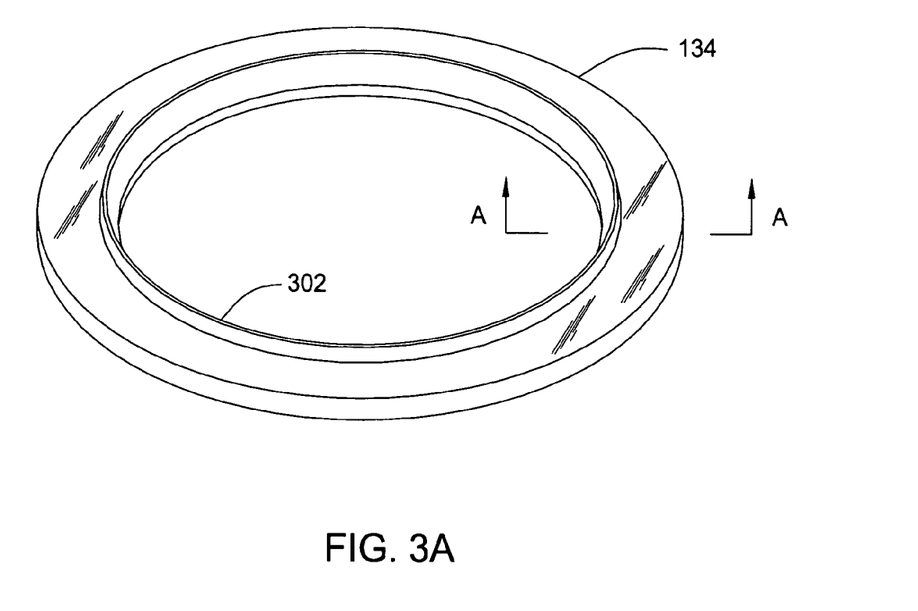
Figure 3B:
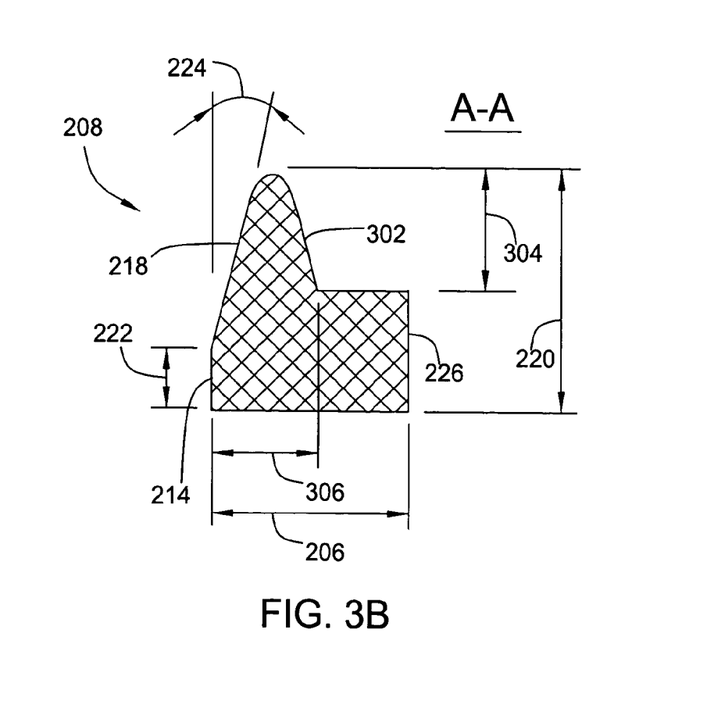

FIGS. 3A and 3B depict the annular ring 134 having a continuous lip 302. In operation, the lip 302 guides the substrate 112 into the substrate pocket 150 as the lift pins retract and the substrate is lowered into the pocket. The lip 302 generally has a height 304 of about 0.5 to 5 mm, while a ratio of the height 304 to a width 306 of the lip is between about 0.3:1 and 3:1.

Figure 4A:
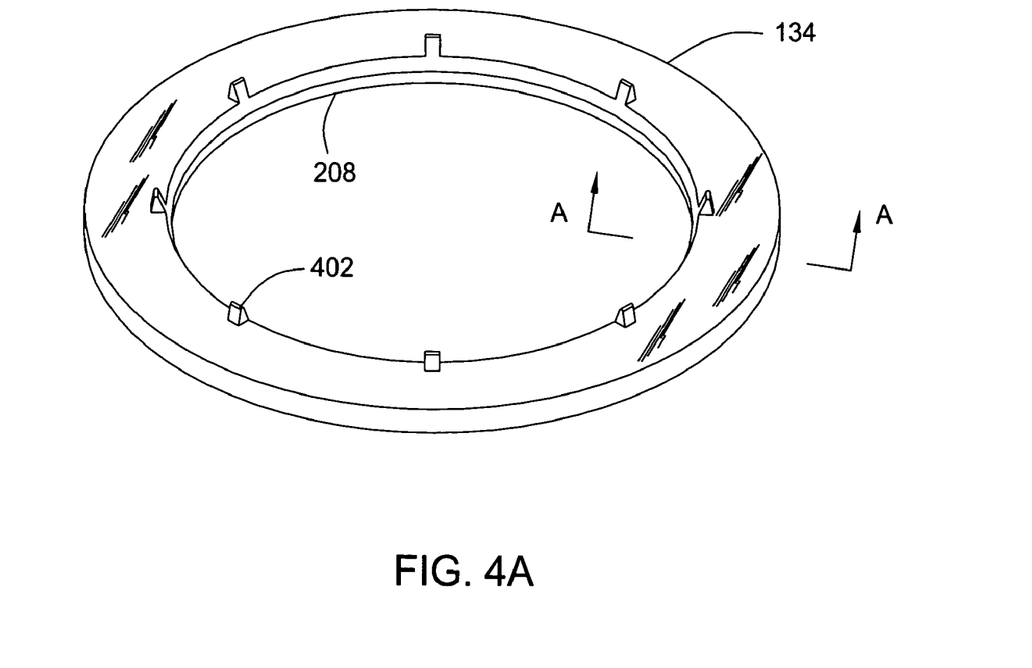
Figure 4B:
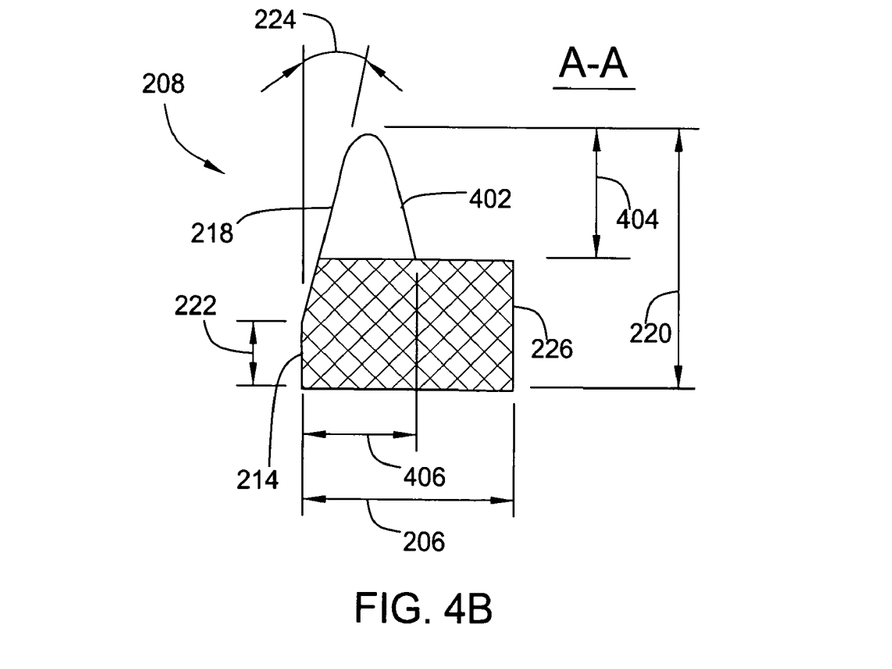

FIGS. 4A and 4B depict the annular ring 134 having a plurality (e.g., 3 to 12) of crowns 402. Each crown 402 has a height 404 of about 0.5 to 5 mm and a ratio of the height 404 to a width 406 of the crown between about 0.3:1 and 3:1. Similar to the lip 302 (discussed in reference to FIGS. 3A–3B above), the crowns 402 may be used to guide the substrate 112 into the substrate pocket 150 as the lift pins retract and lower the substrate is lowered into the pocket. In one embodiment, the crowns are equidistantly disposed around the inner edge 208 of the annular ring 134. Such crowns may be fabricated, for example, from the continuous lip 302 by removing portions of the lip disposed between adjacent crowns.

Figure 5A:
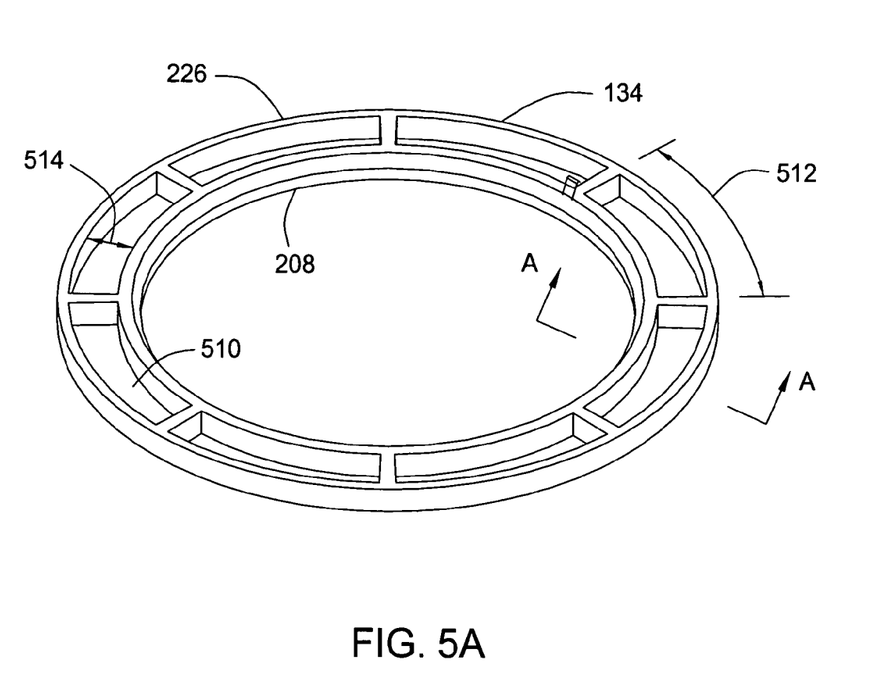
Figure 5B:
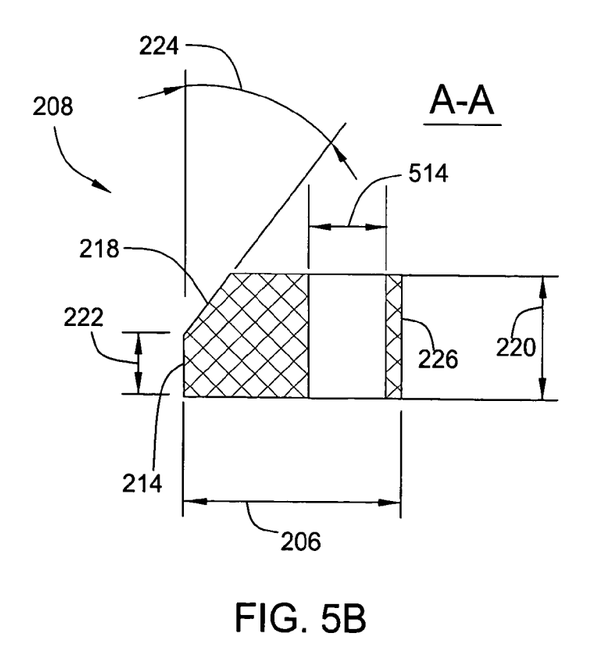

FIGS. 5A and 5B depict the annular ring 134 having a plurality (e.g., 3 to 12) of circumferential slots 510. Generally, slots 510 are used to enhance coupling of RF energy produced by the source 122 of substrate bias power and the plasma 140. In one embodiment, each slot 510 has a length 512 and a width 514 of about 50 to 200 mm and 8 to 12 mm, respectively. Generally, the slots are disposed substantially equidistantly from one another around the flange 226 of the annular ring 134.

Figure 6A:
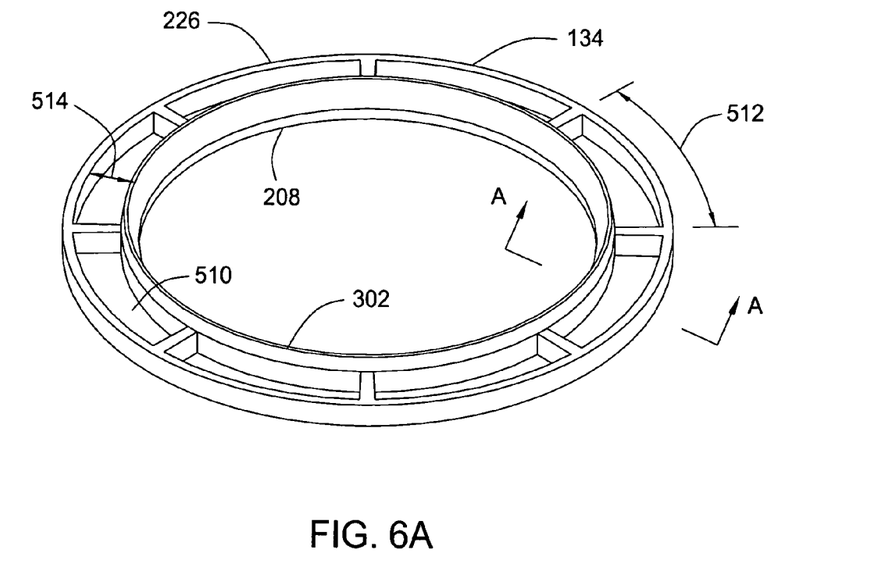
Figure 6B:
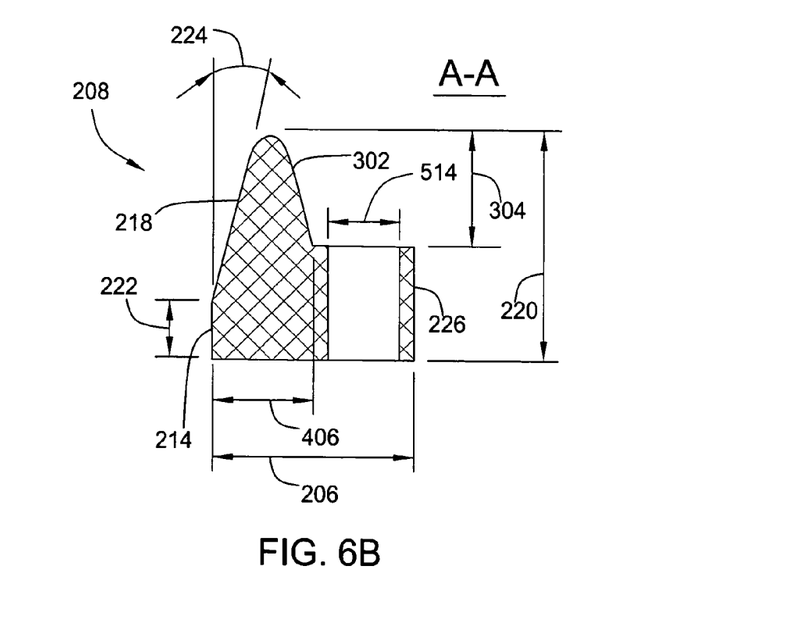
Figure 7A:
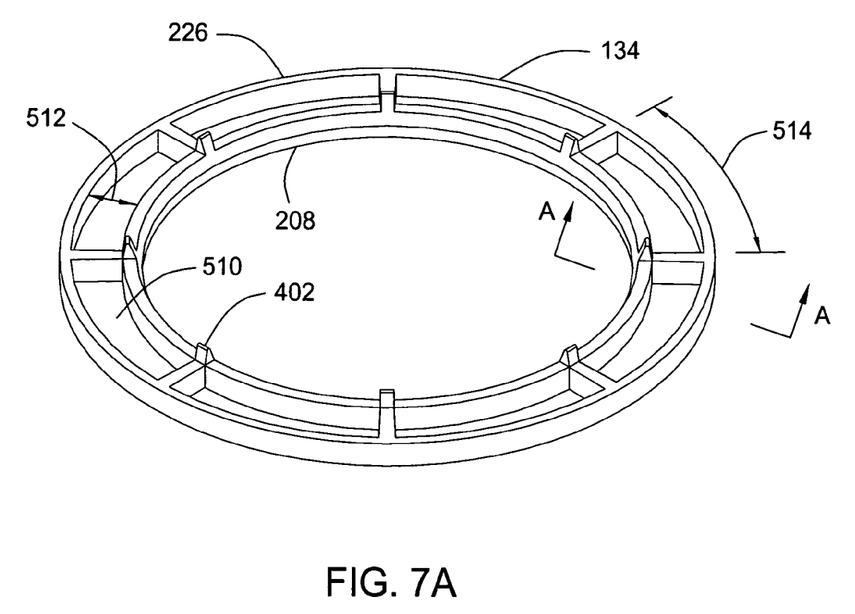
Figure 7B:
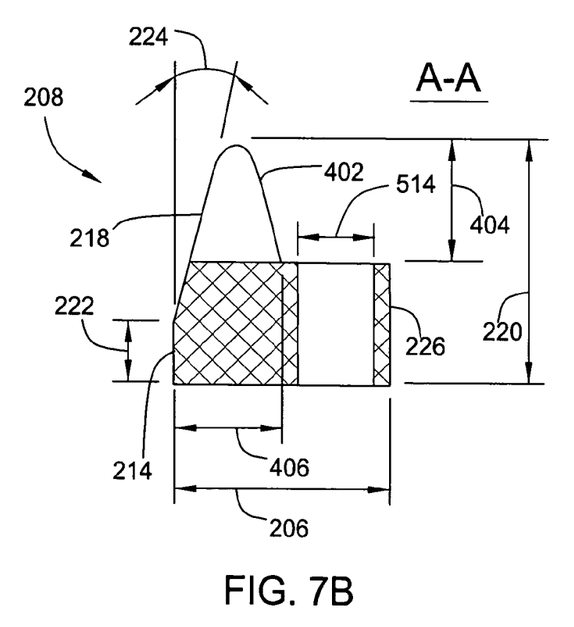

FIGS. 6A and 6B depict the annular ring 134 having the continuous lip 302 and a plurality (e.g., 3 to 12) of the slots 510. Correspondingly, FIGS. 7A and 7B depict the annular ring 134 having a plurality (e.g., 3 to 12) of the crowns 402 and a plurality (e.g., 3 to 12) of the slots 510. Similar to the embodiments in FIGS. 5A and 5B above, slots 510 are used therein to enhance coupling between the source 122 of an RF substrate bias and the plasma 140.

In one illustrative embodiment, the substrate heater assembly 148 having the annular ring 134 may be used in the process chamber 102 of the Producer® reactor during deposition of a layer of carbon doped silicon oxide. The carbon doped silicon oxide is a dielectric material having a low dielectric constant (i.e., low-k material) and available under trademarks BLACK DIAMOND™ or BLACK DIAMOND II™ from Applied Materials, Inc. of Santa Clara, Calif.

In this illustrative embodiment, the BLACK DIAMOND™ layer was deposited on a 200 mm silicon wafer using the Producer® reactor by providing trimethylsilane ($SiC_3H_{10}$) at a rate of 400 to 3000 sccm, oxygen ($O_2$) at a rate of 50 to 1000 sccm (i.e., a $SiC_3H_{10}:O_2$ flow ratio ranging from 1:2.5 to 60:1), applying a cathode bias power between 200 and 1500 W, and maintaining a wafer temperature between 250 and 400 degrees Celsius at a pressure in the process chamber between 2 and 10 mTorr. One exemplary deposition process provided $SiC_3H_{10}$ at a rate of 1700 sccm, $O_2$ at a rate of 750 sccm (i.e., a $SiC_3H_{10}:O_2$ flow ratio of about 2.27:1), applied 1100 W of a bias power, and maintained a wafer temperature of 335 degrees Celsius and a pressure of 4 mTorr.

Figure 10:
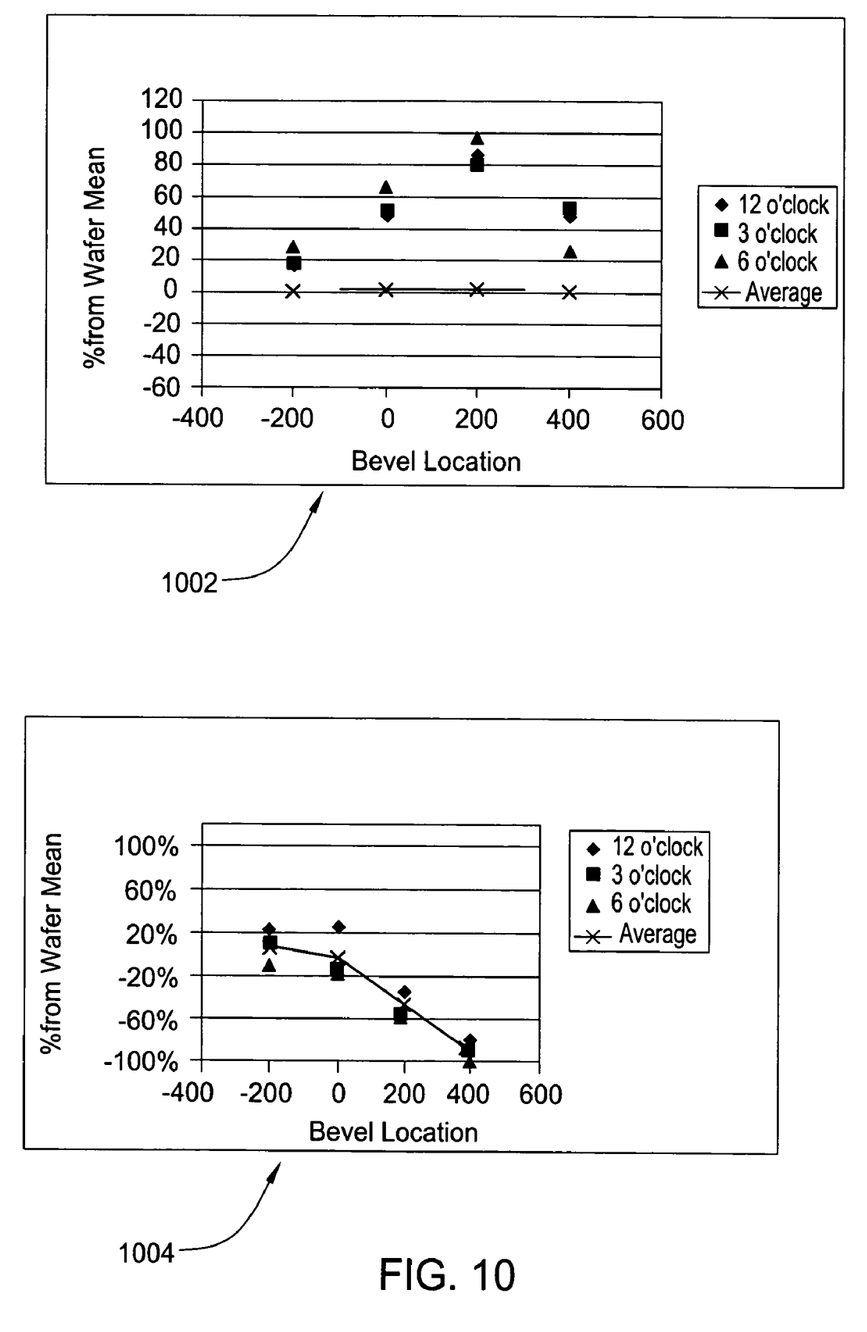
FIG. 10 depicts deposition distribution graphs for substrates processed using a conventional ring and a ring of the present invention.

The vertical height 220 of the wall 210, along with the proximity of the wall 210 to the edge of the substrate promotes uniform deposition across the substrate while protecting edge of the substrate from deposition. In this embodiment, the annular ring 134 had a height 220, a width 206, a wall height 222, and an angle 224 of about 1.5 mm, 13.5 mm, 0.4 mm, and 30 degrees, respectively. The ring 202 was disposed in the substrate pocket 150 with the gap 202 of about 0.14 mm and a gap 212 of about 0.14 mm. Using such a ring, thickness non-uniformity of the deposited BLACK DIAMOND™ layer was decreased to approximately 2.5–2.6%, as well as substrate to substrate variations of the thickness non-uniformity were less than about 2%. Moreover, the small distance of the gap 212 between the edge of the substrate being processed and the annular ring 134 protected the beveled edge of the substrate and the surface 216 of the substrate pocket 150 from unwanted depositions, as well as decreased the thickness of such depositions near the upper portion of the beveled edge of the substrate. In one example, BLACK DIAMOND™ deposition distribution depicted in graph 1004 of FIG. 10 across the beveled edge of the substrate processed using a ring configured as shown in FIG. 7A is substantially less than the deposition distribution depicted in graph 1002 for a conventionally processed substrate.

In an alternative embodiment of the invention, the ring may be integrally incorporated with the heating member as a single contiguous element. Having the advantageous deposition process enhancing features of the ring incorporated integrally into the body of the substrate support assembly provides economy by reducing the number of components while increasing chamber to chamber processing uniformity.

Figure 8:
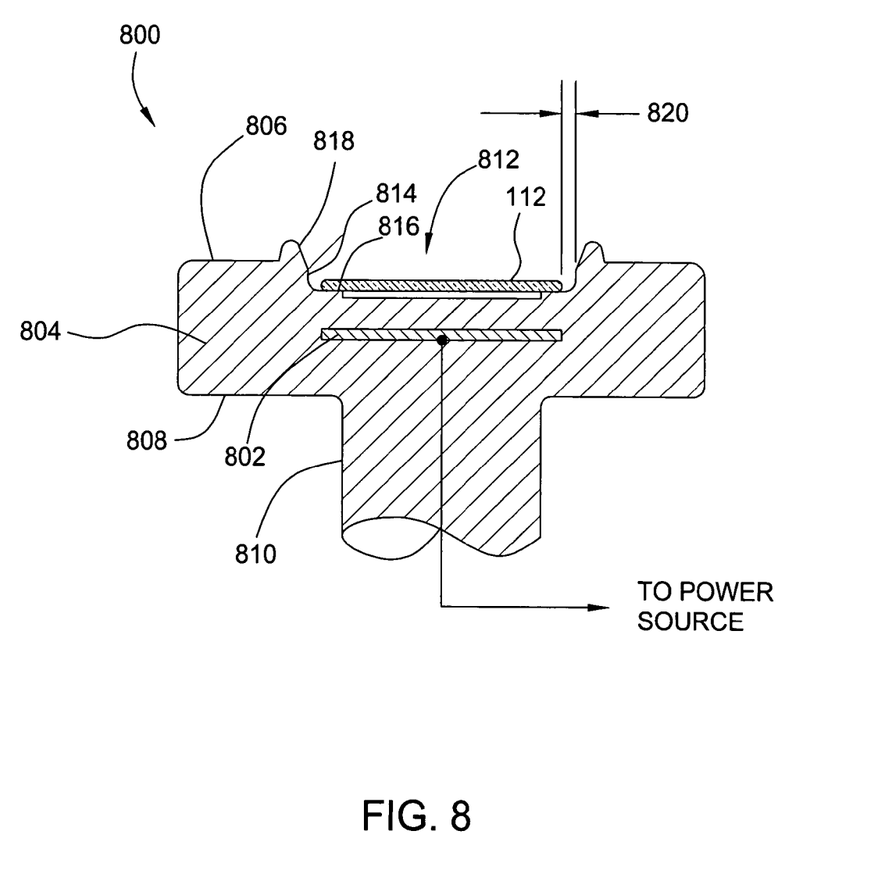
FIG. 8 is another embodiment of a substrate heater assembly.

FIG. 8 is a sectional view of another embodiment of a substrate heater assembly 800. The substrate heater assembly 800 includes at least one heating element 802 embedded in a body 804. The body 804 and heating element 802 may be formed or fabricated as described above. The body 804 includes an upper surface 806 and a lower surface 808. The lower surface 808 is typically coupled by a stem 810 to the processing chamber (not shown).

The upper surface 806 of the body 804 includes a substrate support surface 816 formed therein defining a portion of a substrate receiving pocket. The receiving pocket 812 is bounded by a wall 214 extending upward from the substrate support surface 816 of the pocket 812 and an outwardly flaring bevel 818. The wall 214 is disposed substantially orthogonal to the support surface 216 of the substrate pocket 812 and is configured to extend in a vertical direction at least about one half the thickness of the substrate 112 before meeting the bevel 818. The diameter of the wall 214 is configured to define a gap 820 between the substrate 112 and wall 214 less than about 0.5 mm, and in one embodiment, is in the range of about 0.1 to 0.5 mm to minimize and/or eliminate deposition on the edge of the substrate during processing. The wall 214 and bevel 818 may be configured as described for the wall and bevel of the various ring embodiments described above.

Figure 9A:
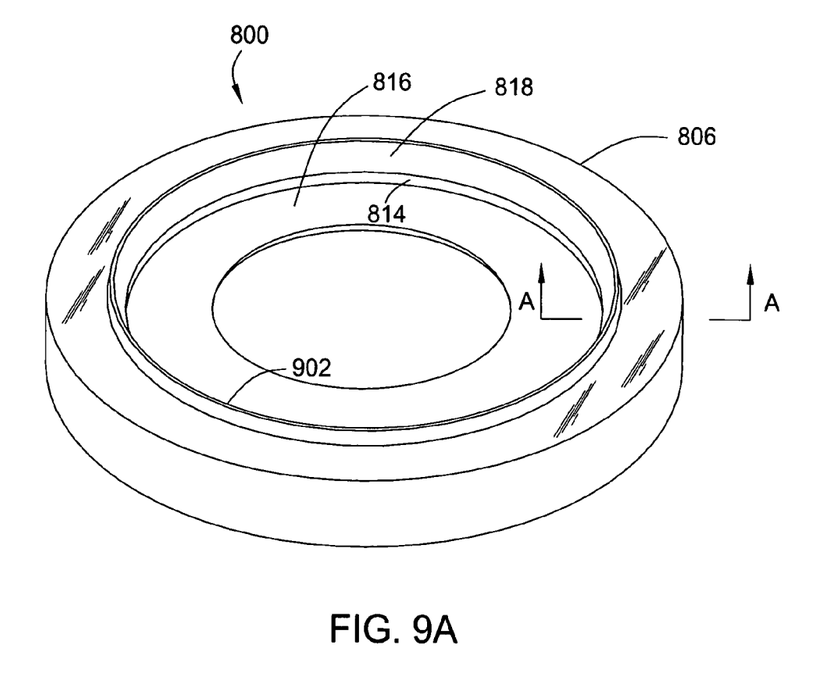
FIGS. 9A–D are perspective and partial sectional views of variations of the substrate heater assembly of FIG. 8.
Figure 9B:
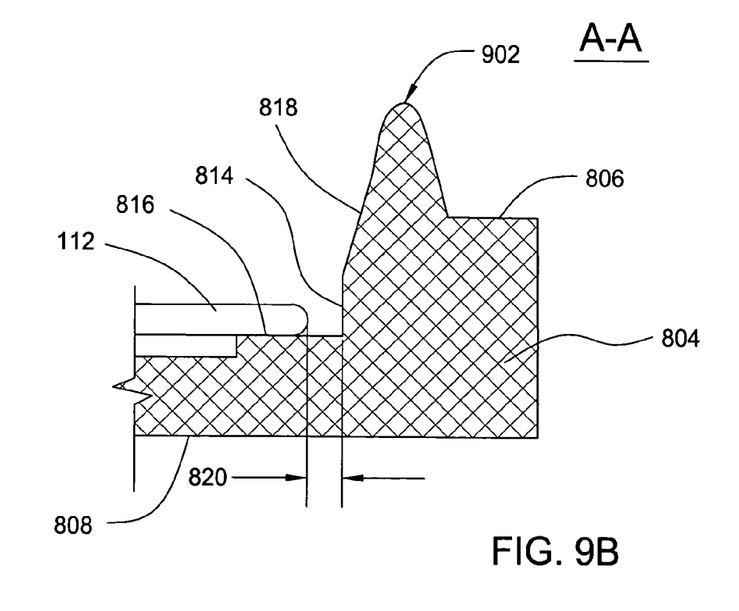
Figure 9C:
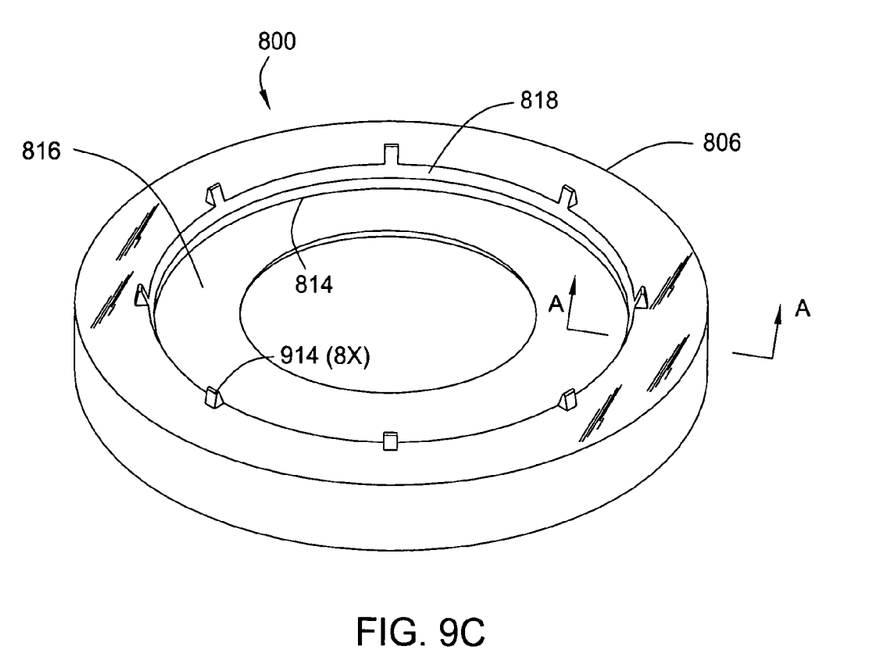
Figure 9D:
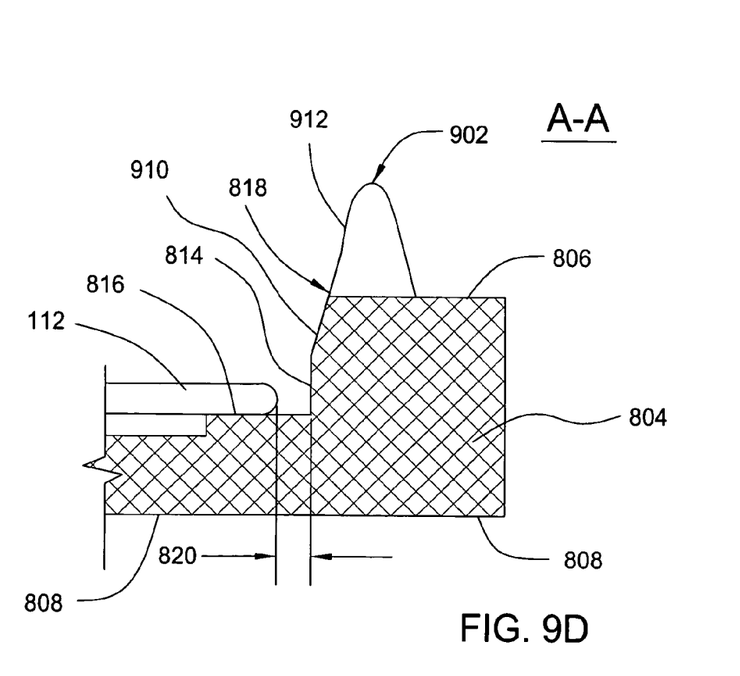

The bevel 818 generally circumscribes the receiving pocket 812 above the wall 214. In one embodiment depicted in FIGS. 9A–B, a portion of the bevel 818 extending beyond the upper surface 806 may define an inner surface of a continuous lip 902, similar to the lip 302 of the ring 134 depicted in FIGS. 3A–B. In another embodiment depicted in FIGS. 9C–D, the bevel 818 may be irregular, having portions 910 terminating at the upper surface 806, and portions 912 extending beyond the upper surface 806 to form inner surfaces of crowns 914, similar to the crowns 402 of the ring 134 depicted in FIGS. 4A–B.

Thus, a heater assembly has been provided that promotes deposition uniformity while limiting deposition along the substrate's edge. In one embodiment, the advantageous features of the invention may be incorporated into the body of the heater assembly, thereby reducing the number of components and cost of the heater assembly while promoting chamber to chamber processing uniformity.

While the foregoing is directed to the illustrative embodiment of the present invention, other and further embodiments of the invention may be devised without departing from the basic scope thereof, and the scope thereof is determined by the claims that follow.

What is claimed is:

1. A substrate heater assembly for supporting a substrate of a predetermined standardized diameter during processing, comprising:
   a body having an upper surface and a lower surface;
   a heating element embedded within the body;
   a substrate support surface formed in the upper surface of the body and defining a portion of a substrate receiving pocket; and
   an annular wall oriented perpendicular to the upper surface and having a length of at least one half a thickness of the substrate the wall bounding an outer perimeter of the substrate receiving pocket and having a diameter less than about 0.5 mm greater than the predetermined substrate diameter.

2. The assembly of claim 1 further comprising:
   a ring disposed in the substrate receiving pocket, wherein the wall is at least a portion of an inner diameter of the ring.

3. The assembly of claim 2, wherein the ring further comprises:
   a bevel flaring outward from the wall of the ring.

4. The assembly of claim 3, wherein the bevel is a continuous lip extending beyond the upper surface and circumscribing the wall.

5. The assembly of claim 3, wherein the bevel further comprises:
   a plurality of discreet crowns extending beyond the upper surface and circumscribing the wall.

6. The assembly of claim 3, wherein the ring further comprises:
   an annular flange radially outward of the wall.

7. The assembly of claim 6, wherein the flange further comprises:
   a plurality of slots formed therein.

8. The assembly of claim 2, wherein the annular ring is formed from a ceramic material.

9. The assembly of claim 2, wherein the annular ring further comprises:
   a height of about 0.7 to 7 mm; and
   a ratio of the height to a width of the annular ring between about 0.05:1 and 0.5:1.

10. The assembly of claim 3, wherein the bevel tapers outward and upward at an angle of about 10 to 40 degrees.

11. The assembly of claim 4, wherein the lip further comprises:
    a height of about 0.5 to 5 mm;
    a ratio of the height to a width of the lip between about 0.3:1 and 3:1; and
    an inner portion tapered outward and upward at an angle of about 10 to 40 degrees.

12. The assembly of claim 5, wherein at least one of the plurality of discreet crowns further comprises:
    a height of about 0.5 to 5 mm;
    a ratio of the height to a width of the crown between about 0.3:1 and 3:1; and
    an inner portion tapered outward and upward at an angle of about 10 to 40 degrees.

13. The assembly of claim 1 wherein the heater member is formed from a ceramic material.

14. The assembly of claim 1, wherein the wall couples the upper surface to the substrate support surface of the body.

15. The assembly of claim 14, wherein the body further comprises:
    a bevel flaring outward from the wall of the body.

16. The assembly of claim 15, wherein the bevel is a continuous lip extending beyond the upper surface and circumscribing the wall.

17. The assembly of claim 15, wherein the bevel further comprises:
    a plurality of discreet crowns extending beyond the upper surface and circumscribing the wall.

18. The assembly of claim 15, wherein the bevel tapers outward and upward at an angle of about 10 to 40 degrees.

19. The assembly of claim 16, wherein the lip further comprises:
    a height of about 0.5 to 5 mm;
    a ratio of the height to a width of the lip between about 0.3:1 and 3:1; and
    an inner portion tapered outward and upward at an angle of about 10 to 40 degrees.

20. The assembly of claim 17, wherein at least one of the plurality of discreet crowns further comprises:
    a height of about 0.5 to 5 mm;
    a ratio of the height to a width of the crown between about 0.3:1 and 3:1; and
    an inner portion tapered outward and upward at an angle of about 10 to 40 degrees.

21. An apparatus for processing a substrate of a predetermined standardized diameter, comprising:
    a chemical vapor deposition chamber having a ceramic substrate heater assembly disposed therein, wherein the heater assembly comprises:
    a body having an uppersurface and a lower surface;
    a heating element embedded within the body;
    a substrate support surface formed in the upper surface of the body and defining portion of a substrate receiving pocket; and
    an annular wall oriented perpendicular to the upper surface and having a length of at least one half a thickness of the substrate, the wall bounding an outer perimeter of the substrate receiving pocket and having a diameter less than about 0.5 mm greater than the predetermined substrate diameter.

22. An apparatus for processing a substrate of a predetermined standardized diameter, comprising:
- a chemical vapor deposition chamber having a ceramic substrate heater assembly disposed therein, wherein the heater assembly comprises:
- a body having an upper surface and a lower surface;
- a heating element embedded within the body;
- a substrate support surface formed in the upper surface of the body and defining a portion of a substrate receiving pocket;
- an annular wall coupled between the substrate support surface and the upper surface, the wall having a length of at least one half a thickness of the substrate and a diameter less than about 0.5 mm greater than the predetermined substrate diameter; and
- a continuous lip protruding from the upper surface and circumscribing the wall, the continuous lip having an inner portion joined with the bevel.

23. The assembly of claim 22, wherein the continuous lip further comprises:
- a height of about 0.5 to 5 mm;
- a ratio of the height to a width of the lip between about 0.3:1 and 3:1; and
- the inner portion tapered outward and upward at an angle of about 10 to 40 degrees.

* * * * *

UNITED STATES PATENT AND TRADEMARK OFFICE
CERTIFICATE OF CORRECTION

PATENT NO. : 7,024,105 B2
APPLICATION NO. : 10/684054
DATED : April 4, 2006
INVENTOR(S) : Fodor et al.

It is certified that error appears in the above-identified patent and that said Letters Patent is hereby corrected as shown below:

Title page,
Item [75], Inventors, delete "Santa Clara," and insert -- Cupertino, --.

Column 7,
Line 42, delete "substrate" and insert -- substrate, --.

Column 8,
Line 56, delete "comprises:" and insert -- comprises; --.
Line 57, delete "uppersurface" and insert -- upper surface --.
Line 60, after "defining" insert -- a --.

Signed and Sealed this

Twenty-seventh Day of June, 2006

JON W. DUDAS
*Director of the United States Patent and Trademark Office*